(12) United States Patent
Marais

(10) Patent No.: US 7,248,103 B2
(45) Date of Patent: Jul. 24, 2007

(54) COMPLEX BAND-PASS FILTER

(75) Inventor: Emmanuel Marais, Peypin (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/336,121

(22) Filed: Jan. 20, 2006

(65) Prior Publication Data

US 2007/0096799 A1   May 3, 2007

(30) Foreign Application Priority Data

Nov. 2, 2005   (FR) .................................. 05 11160

(51) Int. Cl.
 *H03K 5/00* (2006.01)
(52) U.S. Cl. ...................... 327/553; 327/557
(58) Field of Classification Search ........ 327/552–559, 327/147, 156
See application file for complete search history.

(56) References Cited

U.S. PATENT DOCUMENTS

| | | | | |
|---|---|---|---|---|
| 4,253,374 | A * | 3/1981 | Watterman | .................... 84/455 |
| 4,839,542 | A | 6/1989 | Robinson | |
| 4,952,891 | A | 8/1990 | Moulding | |
| 5,117,205 | A * | 5/1992 | Nauta | .................... 331/117 FE |
| 5,136,267 | A * | 8/1992 | Cabot | .......................... 333/174 |
| 5,440,264 | A | 8/1995 | Sevenhans et al. | |
| 5,731,737 | A * | 3/1998 | Cranford et al. | ............. 327/553 |
| 6,011,770 | A * | 1/2000 | Tan | ......................... 369/124.13 |
| 6,137,375 | A * | 10/2000 | Li | ............................... 331/175 |
| 6,181,197 | B1 | 1/2001 | Bret et al. | |
| 6,400,932 | B1 | 6/2002 | Oh et al. | |
| 6,429,733 | B1 | 8/2002 | Pagliolo et al. | |
| 6,930,565 | B1 * | 8/2005 | Vishinsky | ................... 333/17.1 |
| 6,968,173 | B2 * | 11/2005 | Cowley | ....................... 455/323 |
| 7,081,788 | B2 * | 7/2006 | Hagari | ........................ 327/553 |

FOREIGN PATENT DOCUMENTS

WO    WO 02/060048    8/2002

OTHER PUBLICATIONS

Bram Nauta, "A CMOS Transconductance-C Filter Technique for Very High Frequencies," IEEEE Journal of Solid-State Circuits, vol. 27, No. 2, Feb. 1992.
Stevenson et al., An Accurate Quality Factor Tuning Scheme for IF and High—Q Continuous-Time Filters, IEEE Journal of Solid-State Circuits, Dec. 1993, pp. 1970-1978, vol. 33, No. 12, Piscataway, NJ.
French Search Report issued Jun. 19, 2006 for FR Application No. 0511160 filed Nov. 2, 2005, applicant Atmel Corporation.

* cited by examiner

*Primary Examiner*—Dinh T. Le
(74) *Attorney, Agent, or Firm*—Sawyer Law Group LLP

(57) ABSTRACT

A complex band-pass filter. The complex band-pass filter includes a band-pass filter coupled to a voltage source. The band-pass filter includes a first plurality of transconductors that receives a first voltage, where the first voltage controls the center frequency of the band-pass filter. The band-pass filter also includes a second plurality of transconductors, wherein the second plurality of transconductors receives a second voltage, where the second voltage controls the bandwidth of the band-pass filter. According to the system disclosed herein, the complex band-pass filter has automatic frequency tuning against process variations, a programmable center frequency, and a programmable bandwidth. Providing programmability to the center frequency (Fc) and bandwidth (BW) offers an alternative for multi-protected standards with different channels (Fc changes) and for time acquisition improvements (BS changes).

12 Claims, 21 Drawing Sheets

1400

1500

1800

2100

COMPLEX BAND-PASS FILTER

FIELD OF THE INVENTION

The present invention relates to electronics, and more particularly to a complex band-pass filter.

BACKGROUND OF THE INVENTION

Band-pass filters are well known. Band-pass filters are commonly used in communication systems, where high-frequency signals are down converted and often demodulated into low frequency signals. A well-suited architecture is typically chosen depending on the input bandwidth, adjacent channels, and requested sensitivity and selectivity of the system implementing the band-pass filter.

Most band-pass filters are made from conventional transconductors, which typically include differential pairs of transistors, and these band-pass filters are often tuned with a high-impedance bias voltage. Some other filters are tuned with a low-impedance source. For example, filters using the Nauta transconductor are tuned by changing their supply voltage.

Process variations of transconductors are well-known problems. However, conventional solutions for filters tuned with a low-impedance source have not been implemented to adequately address process variations.

Accordingly, what is needed is a system for providing an improved band-pass filter. The present invention addresses such a need.

SUMMARY OF THE INVENTION

A complex band-pass filter is disclosed. The complex band-pass filter includes a band-pass filter coupled to a voltage source. The band-pass filter includes a first plurality of transconductors that receives a first voltage, where the first voltage controls the center frequency of the band-pass filter. The band-pass filter also includes a second plurality of transconductors, wherein the second plurality of transconductors receives a second voltage, where the second voltage controls the bandwidth of the band-pass filter.

According to the system disclosed herein, the complex band-pass filter has automatic frequency tuning against process variations, a programmable center frequency, and a programmable bandwidth.

DETAILED DESCRIPTION OF THE INVENTION

The present invention relates to electronics, and more particularly to a complex band-pass filter. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiment shown, but is to be accorded the widest scope consistent with the principles and features described herein.

A complex band-pass filter is disclosed. The complex band-pass filter includes a band-pass filter that has automatic frequency tuning. In another embodiment, the complex band-pass filter also has a programmable center frequency and a programmable bandwidth. The complex band-pass filter also includes a phase locked loop and buffers that supply separate low-impedance voltages to the band-pass filter. One voltage programs the center frequency and the other voltage programs the bandwidth. To more particularly describe the features of the present invention, refer now to the following description in conjunction with the accompanying figures.

Although the present invention disclosed herein is described in the context of band-pass filters implemented with Nauta transconductors, the present invention may apply to other circuit elements and other types of transconductors, and still remain within the spirit and scope of the present invention.

Figure 1:
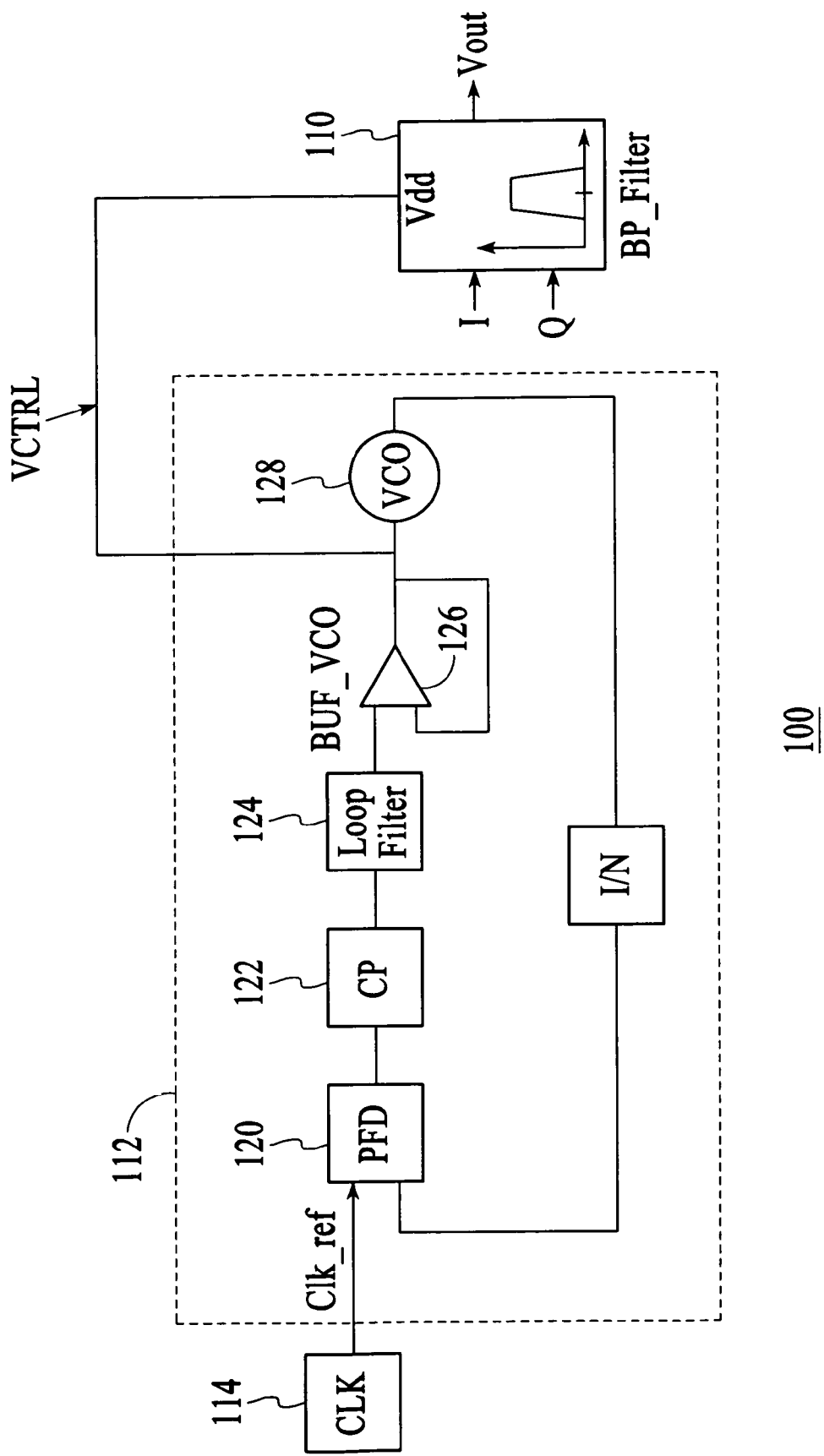
FIG. 1 is a block diagram of a complex band-pass filter with automatic frequency tuning, in accordance with the present invention.

FIG. 1 is a block diagram of a complex band-pass filter 100 with automatic frequency tuning, in accordance with the present invention. The complex band-pass filter 100 includes a band-pass filter 110 and a phase locked loop (PLL) 112, which couples to a reference clock 114. The PLL 112 functions as a voltage source and outputs a control voltage $V_{CTRL}$ for the band-pass filter. The PLL 112 includes a phase frequency detector (PFD) 120, a charge pump (CP) 122, a loop filter 124, a voltage controlled oscillator (VCO) buffer 126, and a VCO 128. The band-pass filter 110 is a continuous time complex transconductance-C (gm-C) integrated filter using transconductors with low input impedance on their control signal.

In operation, the complex band-pass filter 100 utilizes the VCO buffer 126 and the VCO 128 in order to automatically tune the operating frequency of the band-pass filter 110. More specifically, the VCO buffer 126 supplies the control voltage $V_{CTRL}$ to the VCO 128 (and to the band-pass filter 110). The VCO 128 has integrators that utilize transconductors and capacitors such that the time constant of the integrators is proportional to C/gm-diff. The control voltage $V_{CTRL}$ that is outputted by the VCO buffer 126 tunes the time constant of the integrators with the reference clock 114 such that the VCO frequency $F_{vco}$ is process independent as $F_{vco}$ is controlled by the PLL 112, where $F_{vco}=F_{ref}/N$, and where N is an integer and $F_{ref}$ comes from an external quantity with very small temperature and process variations. Also, the center frequency Fc and the bandwidth BW of the band-pass filter 110 depend on the time constant of the integrators. The relationship between the time constant and the control voltage is expressed with the following equation: $t=\propto(C/gm\_diff)$, where $\propto$ is an integer, where $gm\_diff=(VCTRL-Vtn+Vtp)\sqrt{(\beta_n\beta_p)}$, where Vtn and Vtp are NMOS and PMOS threshold voltages, respectively, where $\beta_{n/p}=\mu_{n/p}Cox(W/L)_{n/p}(e^-/holes)$ and where $(e^-/holes)=$mobility.

The input impedance of the control voltage $V_{CTRL}$ is sufficiently high, like that of a metal oxide semiconductor (MOS) transistor gate to prevent stability problems in the loop filter 124. The VCO buffer 126 does not disturb the stability of the PLL loop as long as its gain bandwidth product is sufficiently larger than the center frequency (Fc) of the band-pass filter 110. In an alternative embodiment of the present invention, the control voltage $V_{CTRL}$ may be directly provided by a supply voltage other than a PLL.

Figure 2:
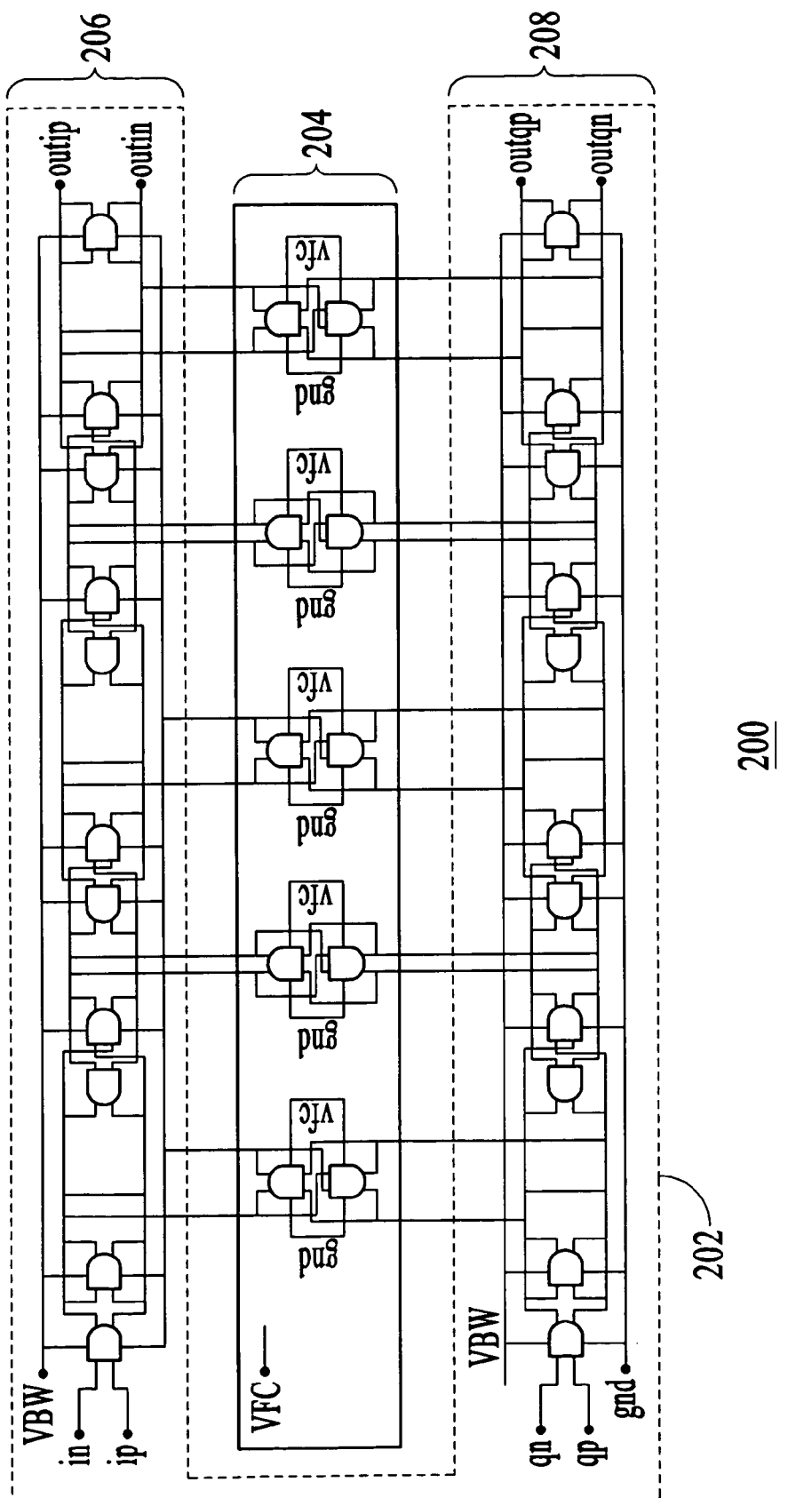
FIG. 2 is a schematic diagram of a band-pass filter, which may be used to implement the band-pass filter of FIG. 1, in accordance with the present invention.

FIG. 2 is a schematic diagram of a band-pass filter 200, which may be used to implement the band-pass filter 110 of FIG. 1, in accordance with the present invention. The band-pass filter 200 includes a group of transconductors 202 that is adapted to receive a voltage $V_{BW}$. The voltage $V_{BW}$ controls the bandwidth of the band-pass filter 200. The band-pass filter 110 also includes a group of transconductors 204 that is adapted to receive a voltage $V_{FC}$. The voltage $V_{FC}$ controls the center frequency of the band-pass filter 200. In this specific embodiment, the band-pass filter 200 includes differential channels 206 and 208, which are coupled to the transconductors 204. Also, the band-pass filter 200 is a 10th order band-pass filter and has a low operating voltage (e.g. 1.6V).

Figure 3:
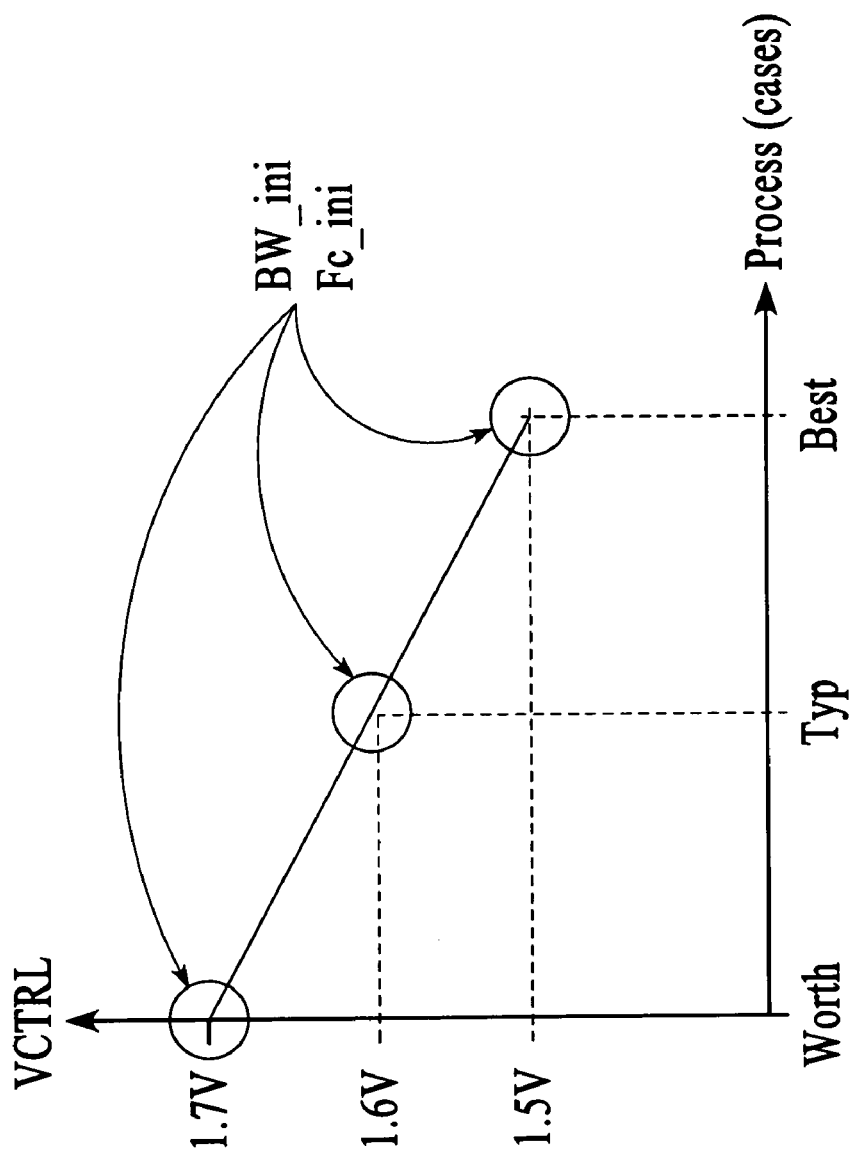
FIG. 3 is a chart showing $V_{CTRL}$ versus process variations when the voltages $V_{FC}=V_{BW}=V_{CTRL}$, in accordance with the present invention.

Referring to both FIGS. 1 and 2 together, if the voltages $V_{BW}$ and $V_{FC}$, and the control voltage $V_{CTRL}$ are tied together, there is automatic frequency tuning of the band-pass filter 200, as the voltages $V_{BW}$ and $V_{FC}$ will track the control voltage $V_{CTRL}$. FIG. 3 is a chart showing $V_{CTRL}$ versus process variations when the voltages $V_{FC}=V_{BW}=V_{CTRL}$, in accordance with the present invention. If $V_{FC}=V_{BW}=Vdd$ (=$V_{CTRL}$), the center frequency Fc and the bandwidth BW of the band-pass filter will be constant regardless of process variations and will be equal to an initial (pre-designed) center frequency Fc and the bandwidth BW. If any process variations occur, $V_{CTRL}$ will move in order to keep the same Fc and BW. $V_{CTRL}$ will automatically move inside the PLL to reach the relationship, $F_{VCO}=Fref/N$ (system). This is the automatic frequency tuning, depending on the available (external) reference frequency and Fc. $F_{VCO}$ can vary and will depend on the specific implementation (e.g., $F_{VCO}=Fc$, $F_{VCO}=2Fc$, etc.). In a specific example, a $V_{CTRL}$ of 1.6V corresponds to a center frequency Fc of 4 MHz and a bandwidth BW of 3 MHz.

In this specific embodiment, because the voltages $V_{BW}$ and $V_{FC}$ are tied together, there is no separate programmability of the center frequency and the bandwidth. Embodiments where there is automatic frequency tuning and separate programmability of the center frequency and programmability of the bandwidth are described further below.

Figure 4:
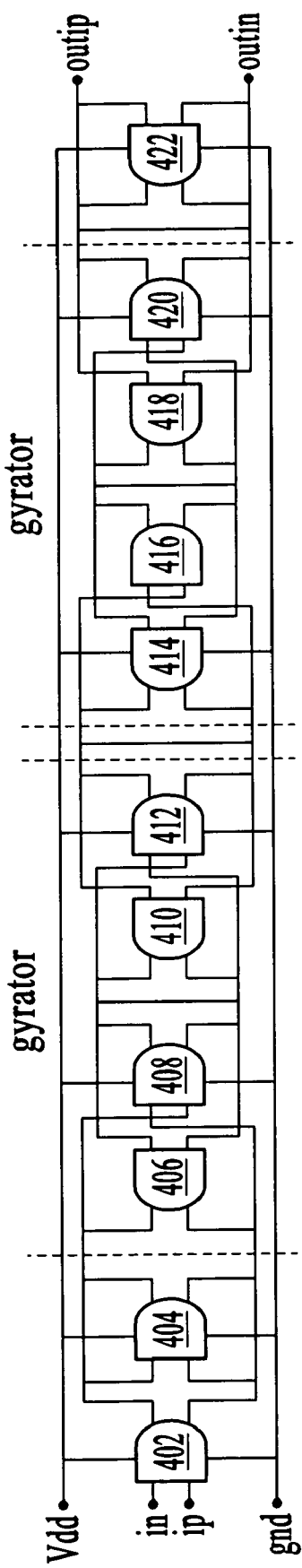
FIG. 4 is a schematic diagram of a differential channel, which can be used to implement each of the differential channels of FIG. 2, in accordance with the present invention.

FIG. 4 is a schematic diagram of a differential channel 400, which can be used to implement each of the differential channels 206 and 208 of FIG. 2, in accordance with the present invention. The differential channel 400 includes transconductors 402 to 422 and functions as a passive low-pass filter. The operation of differential channels are well known.

Figure 5:
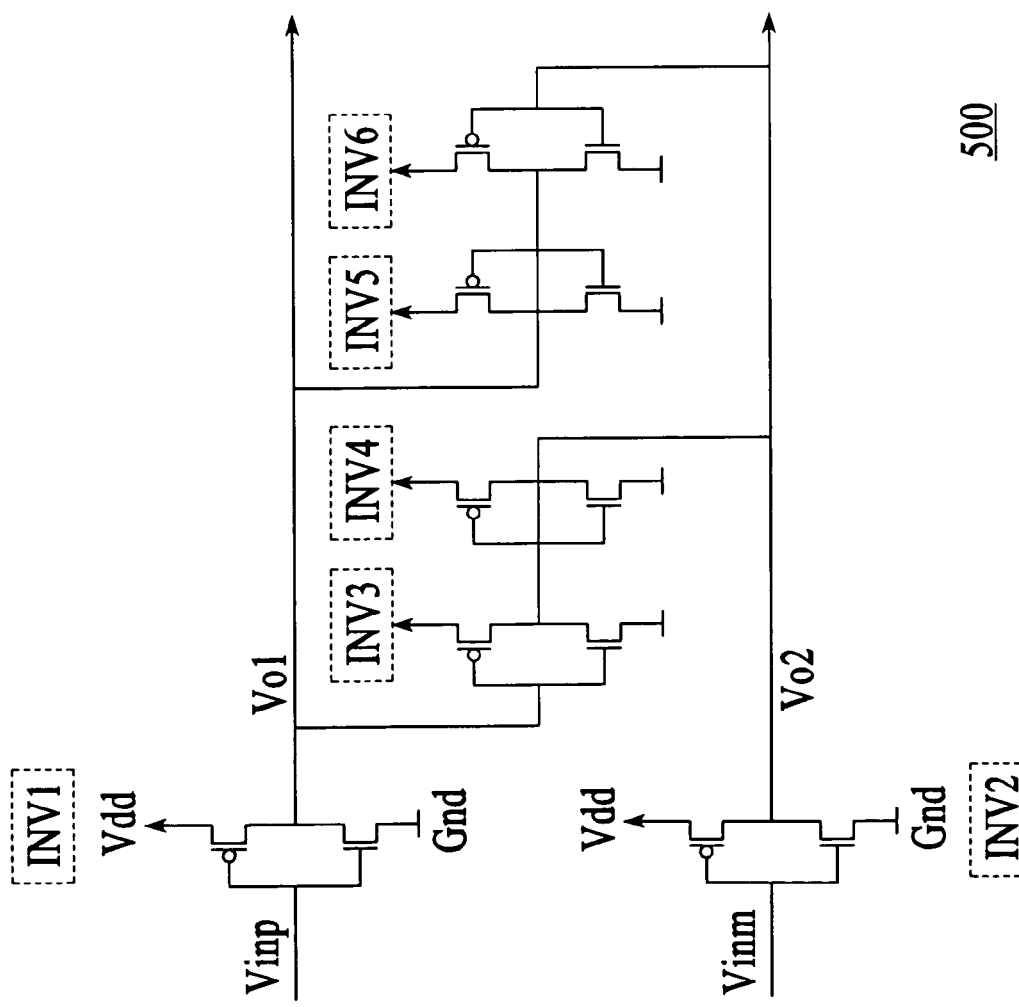
FIG. 5 is a schematic diagram of a transconductor, which may be used to implement each of the transconductors of FIGS. 2 and 3.

FIG. 5 is a schematic diagram of a transconductor 500, which may be used to implement each of the transconductors of FIGS. 2 and 3. The transconductor 500 is referred to as a Nauta transconductor. Nauta transconductors are based on simple inverters and receive a low-impedance control signal. Nauta transconductors and the operation of Nauta transconductors are well known. In order to achieve better precision and good characteristics of the band-pass filter 110 (FIG. 1), a DC gain enhancement is realized due to the "negative resistor" principle (INV3, INV4, INV5, and INV6). As can be seen in equation [1] (shown in FIG. 5), the transconductor differential (gm_diff) is linear with Vdd. In accordance with the present invention, Vdd functions as the control voltage $V_{CTRL}$ (FIG. 1) for the automatic frequency tuning. Although the present invention disclosed herein is described utilizing a Nauta transconductor, the present invention may utilize other types of transconductors, and still remain within the spirit and scope of the present invention.

Figure 6:
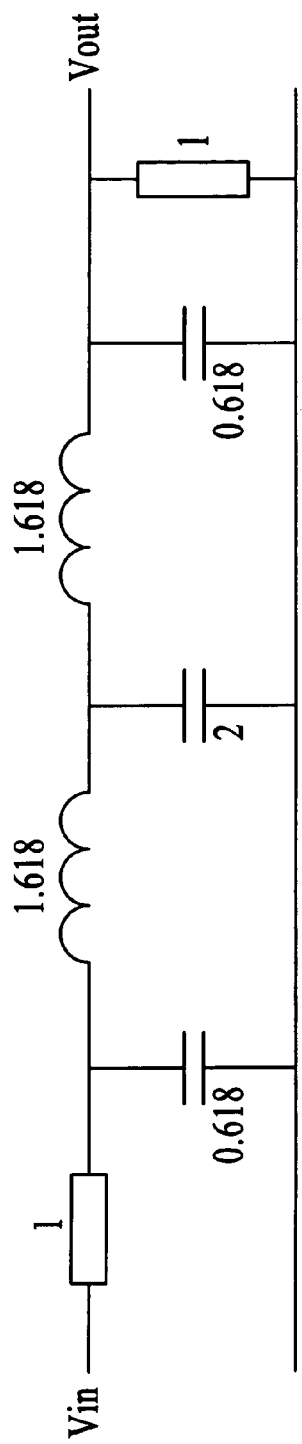
FIG. 6 is a schematic diagram of a passive low-pass filter, which represents the differential channel of FIG. 4.

FIG. 6 is a schematic diagram of a passive low-pass filter 600, which represents the differential channel 400 of FIG. 4. In this specific embodiment, the low-pass filter 600 is a normalized single-ended low-pass 5th order Butterworth filter. The transconductors 402-422 of FIG. 4 emulate the resistors and inductors (electronic gyrators) shown in FIG. 6.

Referring to both FIGS. 2, 4, and 6 together, the differential channel 400 is used to implement a low-pass filter, which is in turn used to create the band-pass filter 200 of FIG. 2. The differential channel 400 has good sensitivity and dynamic range properties and is thus an ideal component for a gm-C filter. In order for the band-bass filter 200 of FIG. 2 to be centered on a particular intermediate frequency (IF) and bandwidth (e.g. 4 MHz with a 3 MHz bandwidth), the low-pass filter 600 is designed with a particular center frequency (e.g. 1.5 MHz).

Figure 7:
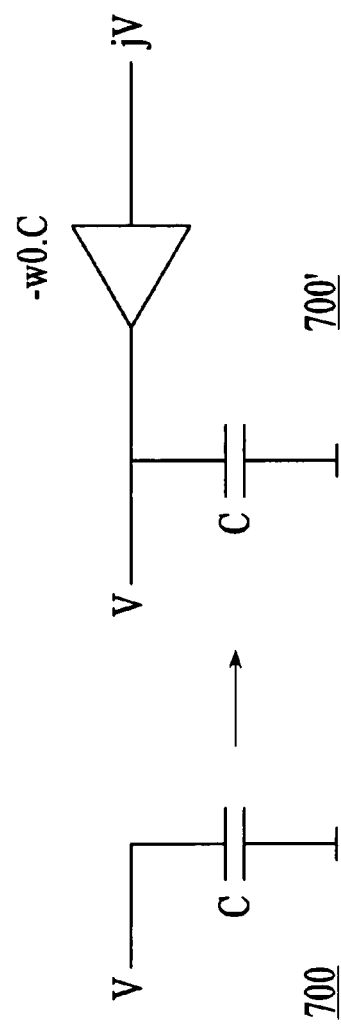
FIG. 7 is a schematic diagram illustrating a complex transformation on internal nodes for the band-pass filter of FIG. 2, in accordance with the present invention.

FIG. 7 is a schematic diagram illustrating a complex transformation on internal nodes for the band-pass filter 200 of FIG. 2, in accordance with the present invention. The complex transformation is a transformation from the differential channel 400 (FIG. 4) to the band-pass filter 200 (FIG. 2), which is applied using an in-phase signal (I signal) and a quadrature-phase signal (Q signal) (shown as "I" and "Q" in FIG. 1).

In mathematical terms, the complex transformation is represented by the following expression: H(jw)->H(jw−jw0). In a gm-C filter, this transformation is applied to each reactive component (C) in a prototype low-pass filter: jw C->j(w−w0).C=jw.C−jw0.C. Using this transformation for each internal node of the differential channel 206 and 208 of FIG. 2 results in the active implementation of the band-pass filter 200.

Referring again to FIG. 2, in accordance with the present invention, the center frequency (Fc) and bandwidth (BW) the band-pass filter 200 can be programmed. In order to program the center frequency Fc and the bandwidth BW, two supply voltages are used. One supply voltage $V_{FC}$ is dedicated to controlling the center frequency Fc, and the other supply voltage $V_{BW}$ is dedicated to controlling the bandwidth BW. The center frequency Fc of the band-pass filter 200 is determined by the gm_diff of the set of transconductors 204. The supply voltage $V_{FC}$ of the transconductors in the differential channels 206 and 208 determines the gm_diff of the initial low-pass filter and hence determines the final bandwidth BW of the bass-pass filter.

Figure 8:
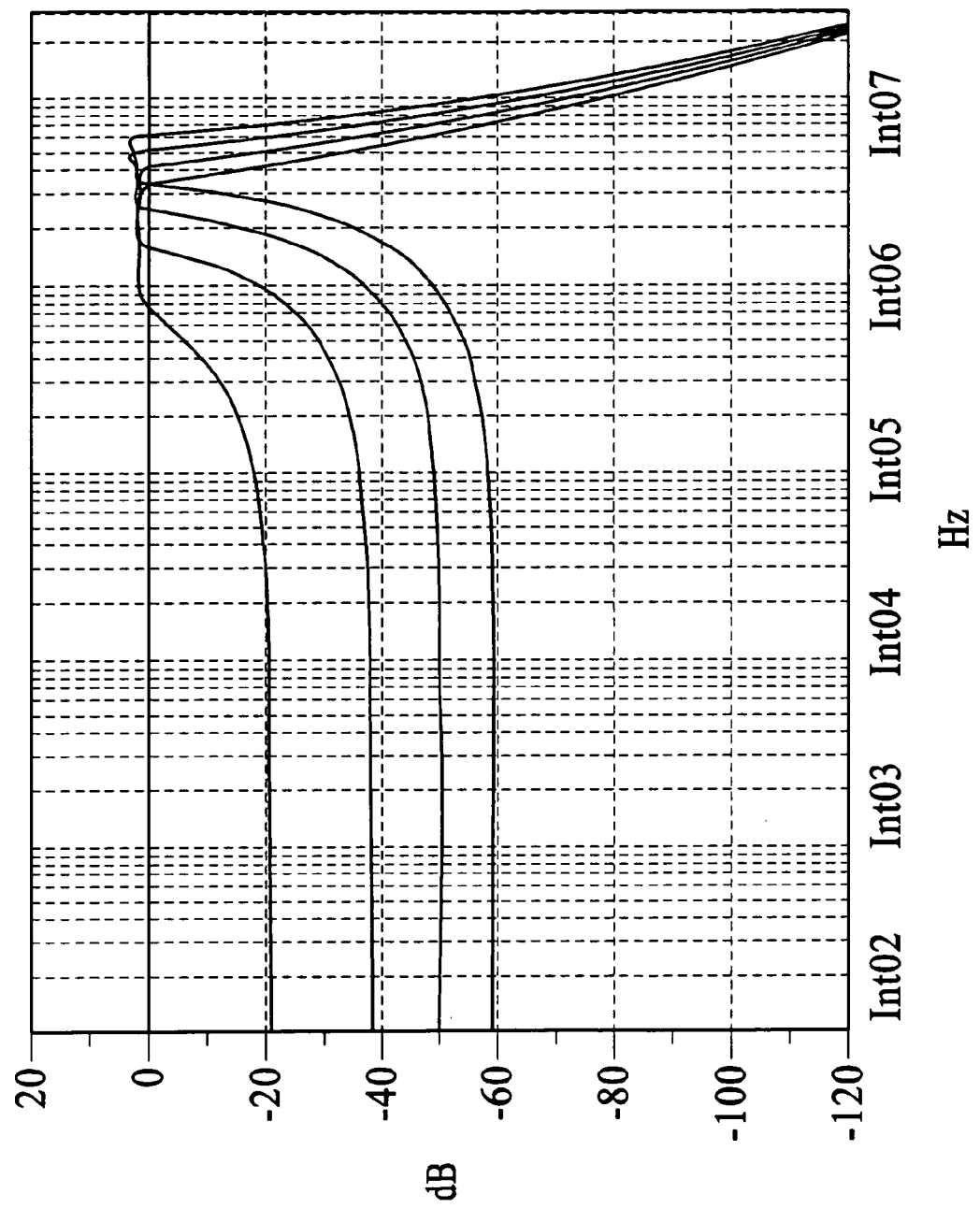
FIG. 8 is a chart showing AC responses of the band-pass filter with respect to VFC changes, in accordance with the present invention.
Figure 9:
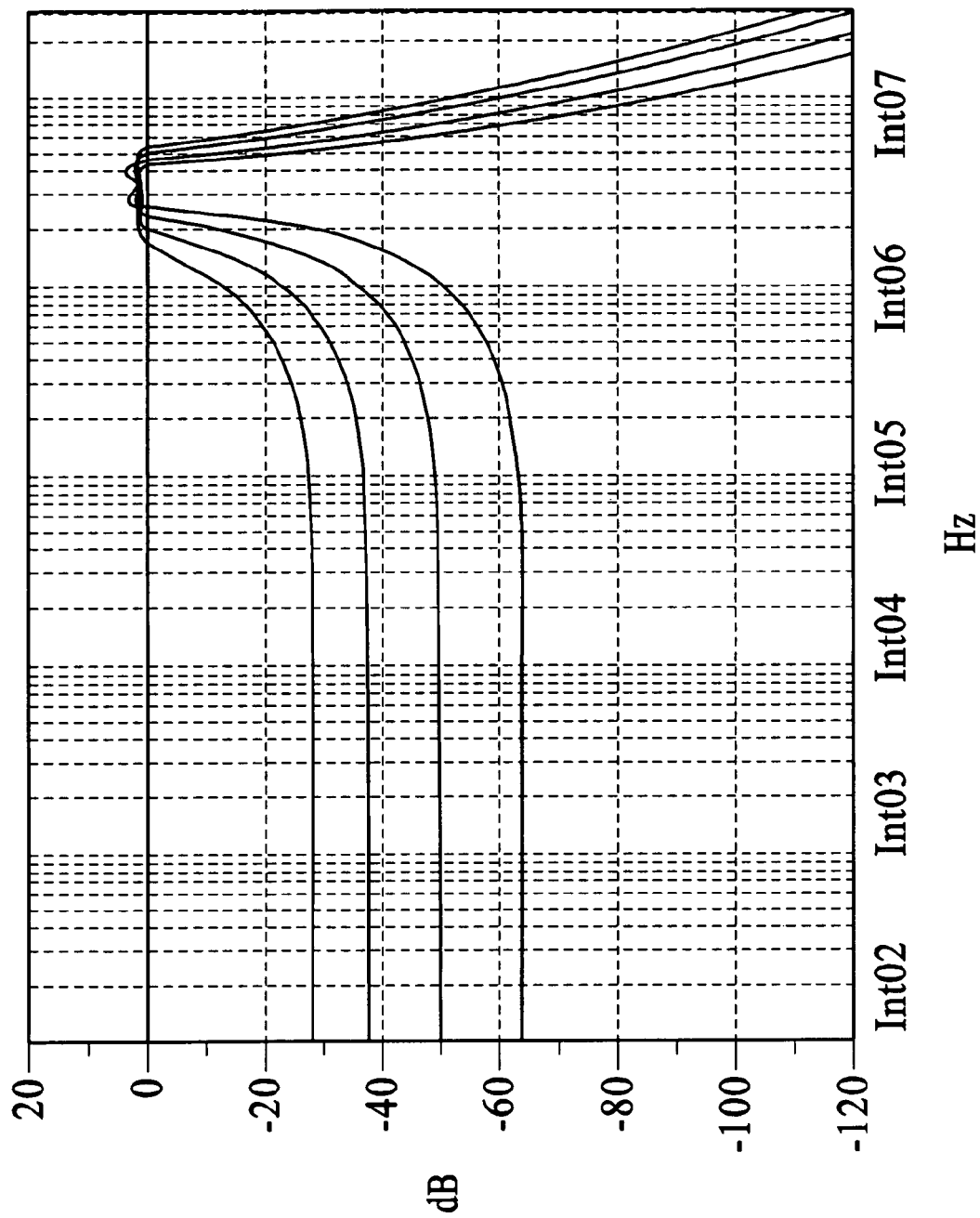
FIG. 9 is a chart showing AC responses of the band-pass filter with respect to $V_{BW}$ changes, in accordance with the present invention.

FIG. 8 is a chart showing AC responses of the band-pass filter 200 with respect to VFC changes, in accordance with the present invention. FIG. 9 is a chart showing AC responses of the band-pass filter 200 with respect to $V_{BW}$ changes, in accordance with the present invention.

Figure 10:
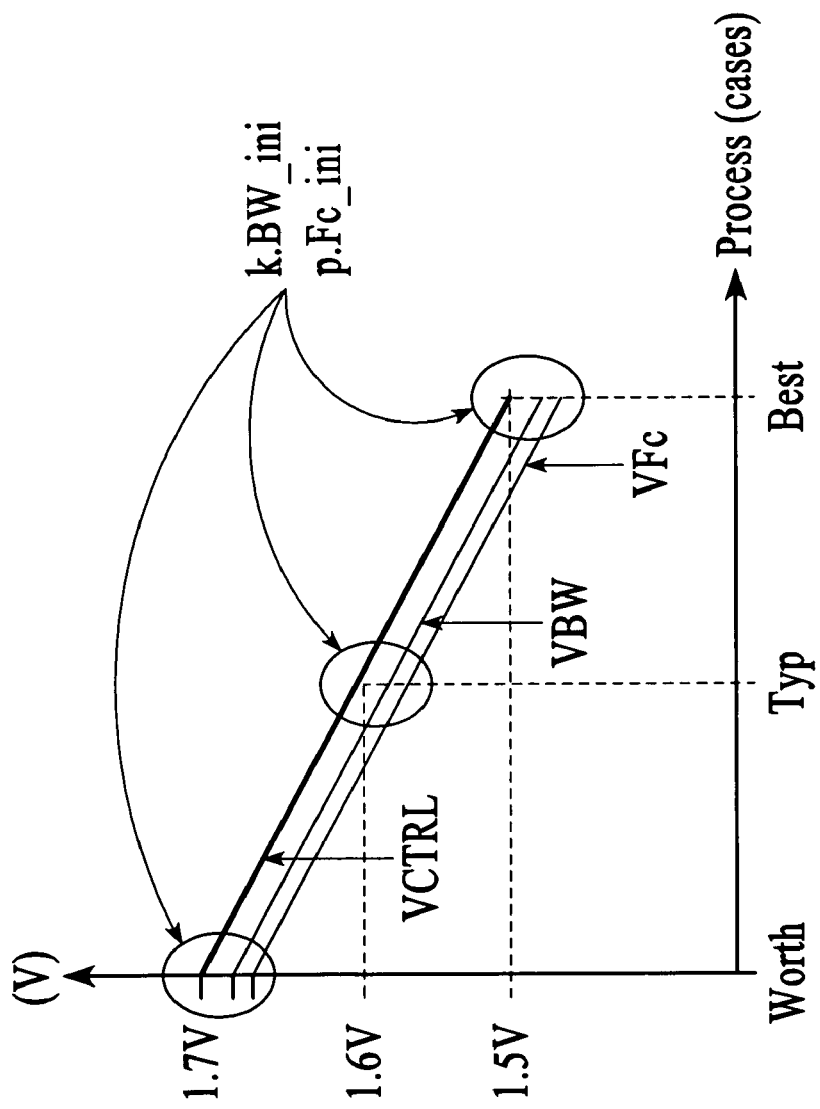
FIG. 10 is chart showing $V_{CTRL}$, $V_{FC}$, and $V_{BW}$ versus process variations when $V_{FC}$ and $V_{BW}$ are ratios of $V_{CTRL}$, in accordance with the present invention.

FIG. 10 is chart showing VCTRL, VFC, and VBW versus process variations where VFC and VBW are ratios of VCTRL, in accordance with the present invention. If VFC=k, and VCTRL and VBW=p (k and p being integers), and if any process variations occur, those initial ratios (k and p) remain the same in order to keep the same values of Fc and BW as illustrated in FIG. 3. In a specific example, if VFC=0.9*VCTRL_typ=1.44V, and VBW=0.8*VCTRL_typ=1.28 V, then BW=2 MHz and Fc=3 MHz. An embodiment that may be implemented to separately control VFC and VBW is described further below in FIG. 12.

Figure 11:
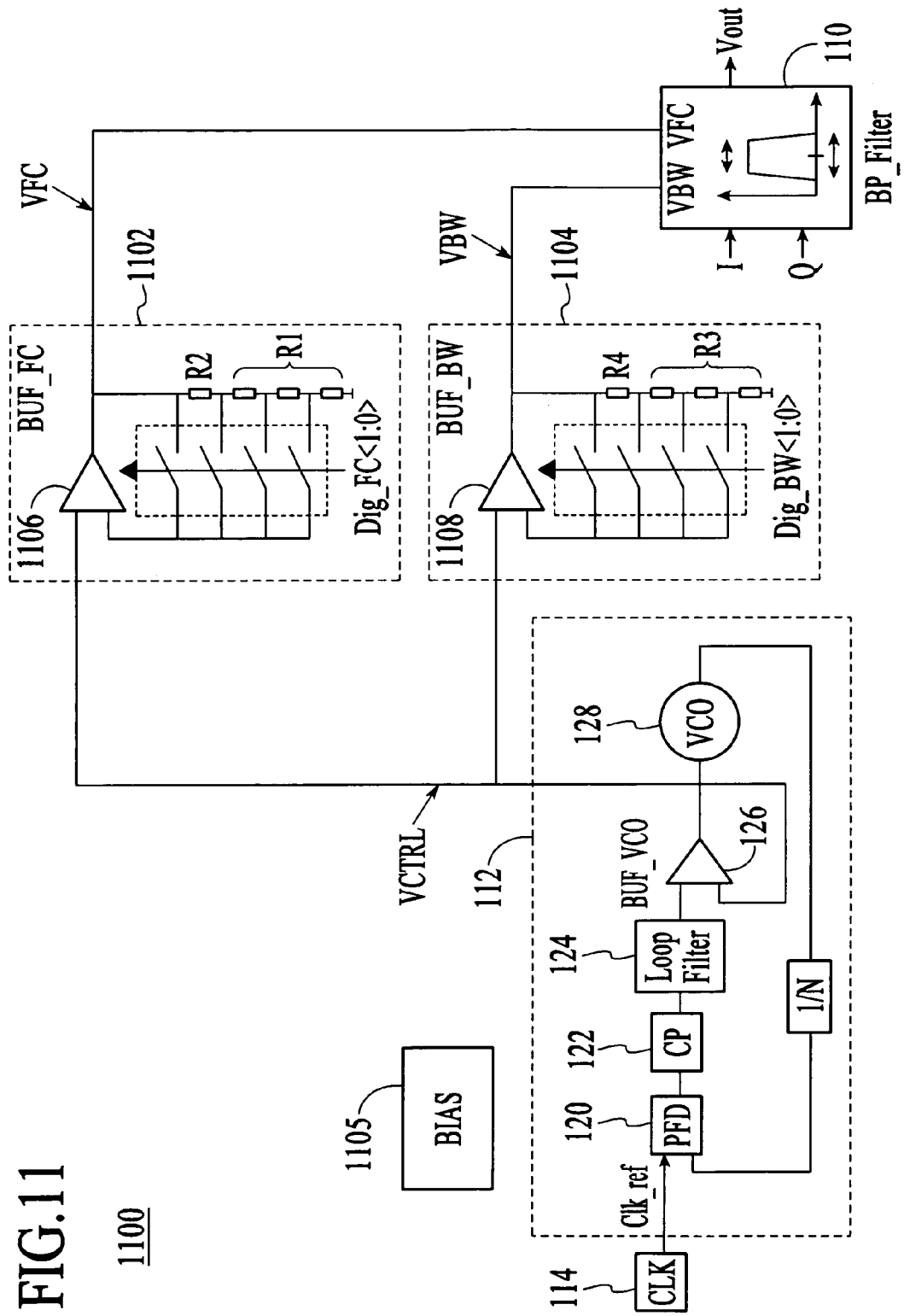
FIG. 11 is a block diagram showing a complex band-pass filter where the center frequency Fc and the bandwidth BW are programmable, in accordance with the present invention.

FIG. 11 is a block diagram showing a complex band-pass filter 1100 where the center frequency Fc and the bandwidth BW are programmable, in accordance with the present invention. Similar to the complex band-pass filter 100 of FIG. 1, the complex band-pass filter 1100 includes a band-pass filter 110 and a phase locked loop (PLL) 112, which couples to a reference clock 114 and outputs a control voltage $V_{CTRL}$. The PLL 112 includes a PFD 120, a charge pump (CP) 122, a loop filter 124, a VCO buffer 126, and a VCO 128. The complex band-pass filter 1100 also includes a center frequency buffer 1102 and a bandwidth buffer 1104 that provides a voltage ratio such that the supply voltages $V_{FC}$ and $V_{BW}$ are ratios of $V_{CTRL}$ and a bias cell 1105. The bias cell 1105 delivers four bias currents (e.g. ibiasp_CP, ibiasp_VCO, ibiasp_Fc, and ibiasp_BW, which are bias currents for the VCO buffer 126, the center frequency buffer 1102, and the bandwidth buffer 1104, respectively). Three bias voltages (e.g. vbiasp, vcasp and vcasn) are also used for internal polarization of the buffers 126, 1102, and 1104.

Figure 12:
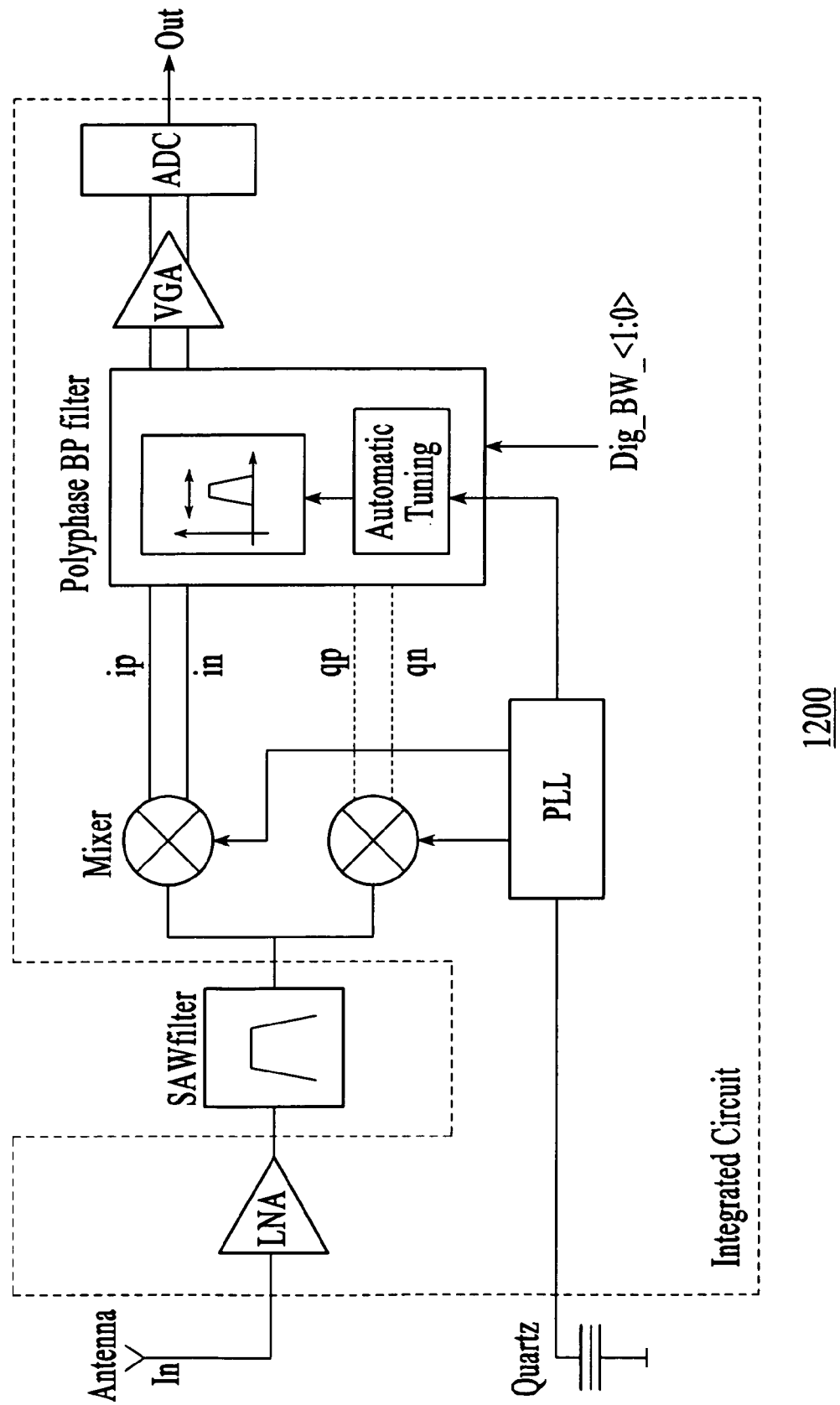
FIG. 12 is a block diagram of an exemplary polyphase filter, in which the band-pass filter of FIG. 2 may be implemented, in accordance with the present invention.

In operation, the voltage $V_{FC}$ controls/regulates the center frequency Fc, and the voltage $V_{BW}$ controls or regulates the bandwidth BW. If the process changes as described above in FIG. 10, the voltages $V_{FC}$ and $V_{BW}$ track the control voltage $V_{CTRL}$. The $V_{FC}$ to $V_{BW}$ ratio stays the same. The resistors R1, R2, R3, and R4 provide resistor ratios and can be adjusted (e.g. by digital commands) to adjust the ratio of the voltages $V_{FC}$ and $V_{BW}$. Providing programmability to the center frequency Fc and the bandwidth BW offers an alternative for multi-protocol standards with different channels (Fc changes) and for time-acquisition improvements (BW changes). The voltages $V_{FC}$ and $V_{BW}$ have the same properties with regard to the process and temperature variations since the $V_{FC}$ and $V_{BW}$ ratio is a function of the resistor ratio, which is process independent. As such, the voltage $V_{FC}$=(R1/R1+R2)*$V_{CTRL}$, and the voltage VBW=(R3/R3+R4)*$V_{CTRL}$. R1 and R3 are respectively modified by digital commands Dig_FC<1:0> and Dig_BW<1:0>. The "initial" control voltage inside the loop ($V_{CTRL}$) is preferably the highest value that can be applied to the complex band-pass filter 1100. The OPAMPs 1106 and 1108 preferably have a high gain and the resistors R1-R4 are preferably large. FIG. 12 is a block diagram of an exemplary polyphase filter 1200, in which the band-pass filter 200 of FIG. 2 may be implemented, in accordance with the present invention. In this specific embodiment, the bandwidth is programmable.

Figure 13:
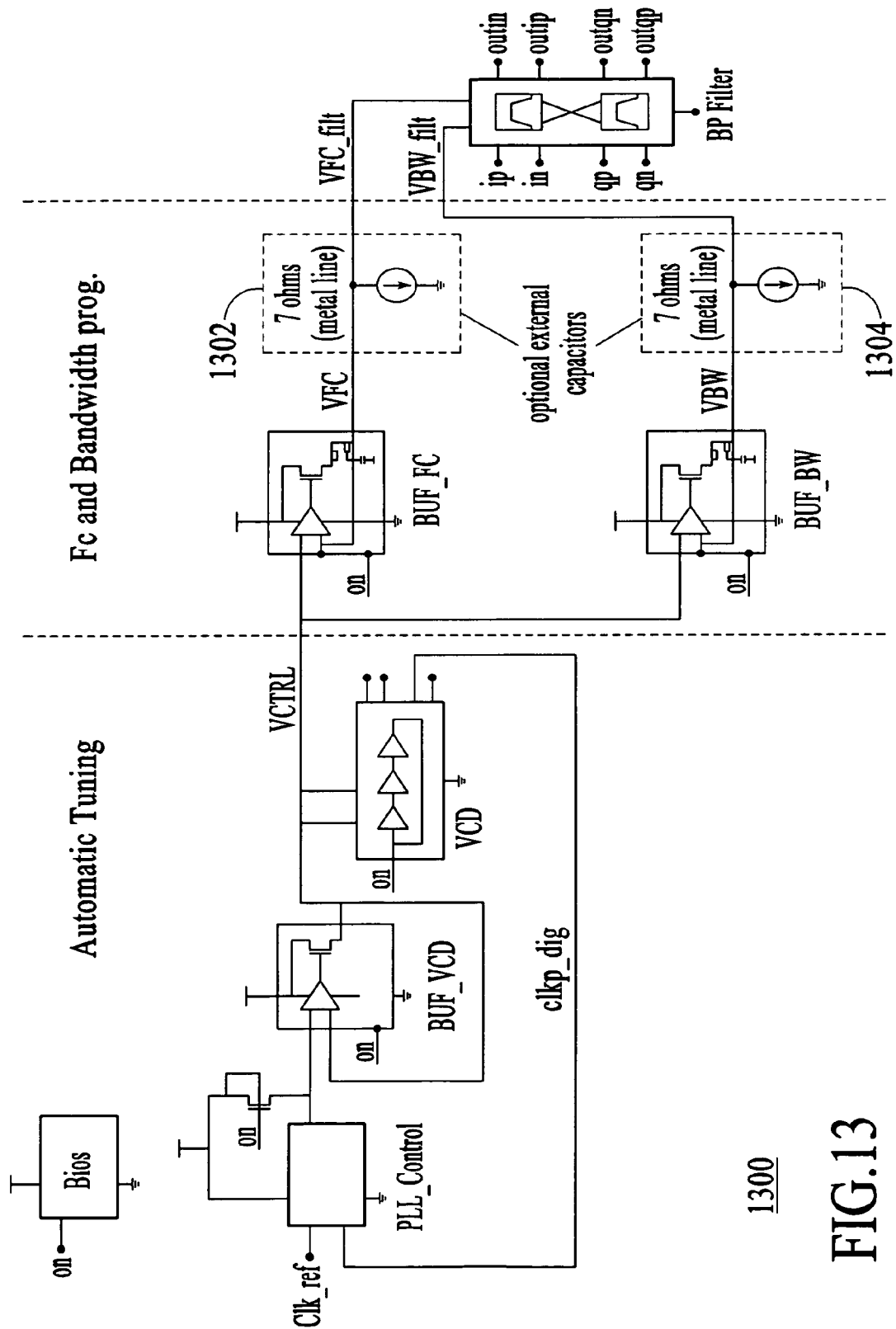
FIG. 13 is a simulation schematic of the complex band-pass filter used to simulate the complex band-pass filter of FIG. 11, in accordance with the present invention.

FIG. 13 is a simulation schematic of the complex band-pass filter 1300 used to simulate the complex band-pass filter 1100 of FIG. 11, in accordance with the present invention. The complex band-pass filter 1300 is similar to the complex band-pass filter 1100 except that the complex band-pass filter 1300 includes optional external capacitors 1302 and 1304. In this specific embodiment, the capacitors 1302 and 1304 include 7 ohm metal lines.

Figure 14:
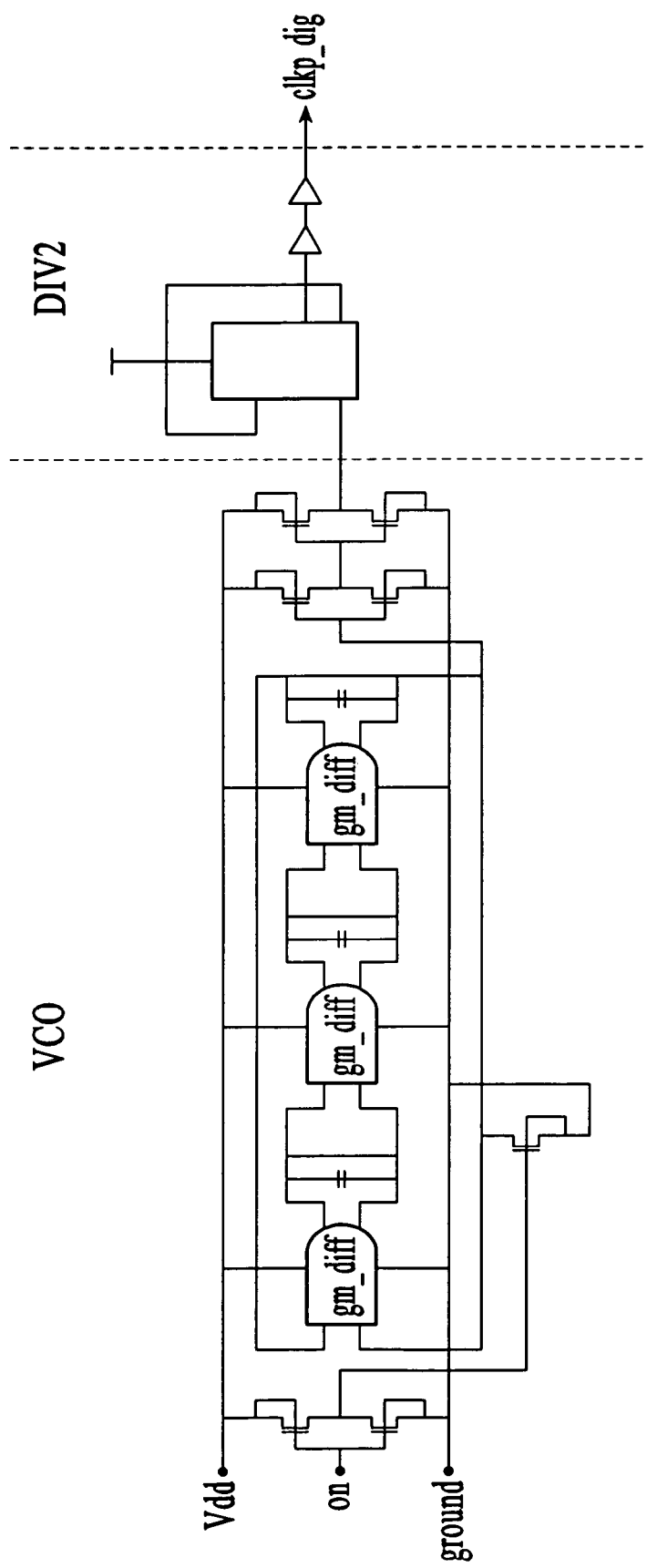
FIG. 14 is a block diagram of a voltage controlled oscillator (VCO), which may be used to implement the VCO of FIGS. 1 and 11, in accordance with the present invention.

FIG. 14 is a block diagram of a voltage controlled oscillator (VCO) 1400, which may be used to implement the VCO 128 of FIGS. 1 and 11, in accordance with the present invention. The inputs include: supply_ext (external supply [1.8V; 2V]); Clk_ref (Reference clock (4.092 MHz) coming from the on-chip PLL in a RF receiver); on (on=1 <-> system on); ip, in, qp, qn (I, Q differential signals coming from a mixer; digFC<1:0> (two bits programming the FC voltage value); and digBW<1:0> (two bits programming the BW value). The outputs include: outputs (outip, outin); and outqp, outqn (I,Q differential outputs of the filter).

The internal outputs include: sup_Fvco (the output of the PLL_Control bloc and this voltage is then buffered to supply the VCO); VCTRL (the output of the VCO buffer BUF_VCO). This voltage is the initial control voltage of the filter. A multiplication factor obtained thanks to the resistor ratio of the center frequency buffer BUF_Fc and the bandwidth buffer BUF_BW give the both voltages needed to change the initial value of the center frequency Fc and the bandwidth BW. In this specific example, the divider factor of output of the VCO 1400 is 2.

Figure 15:
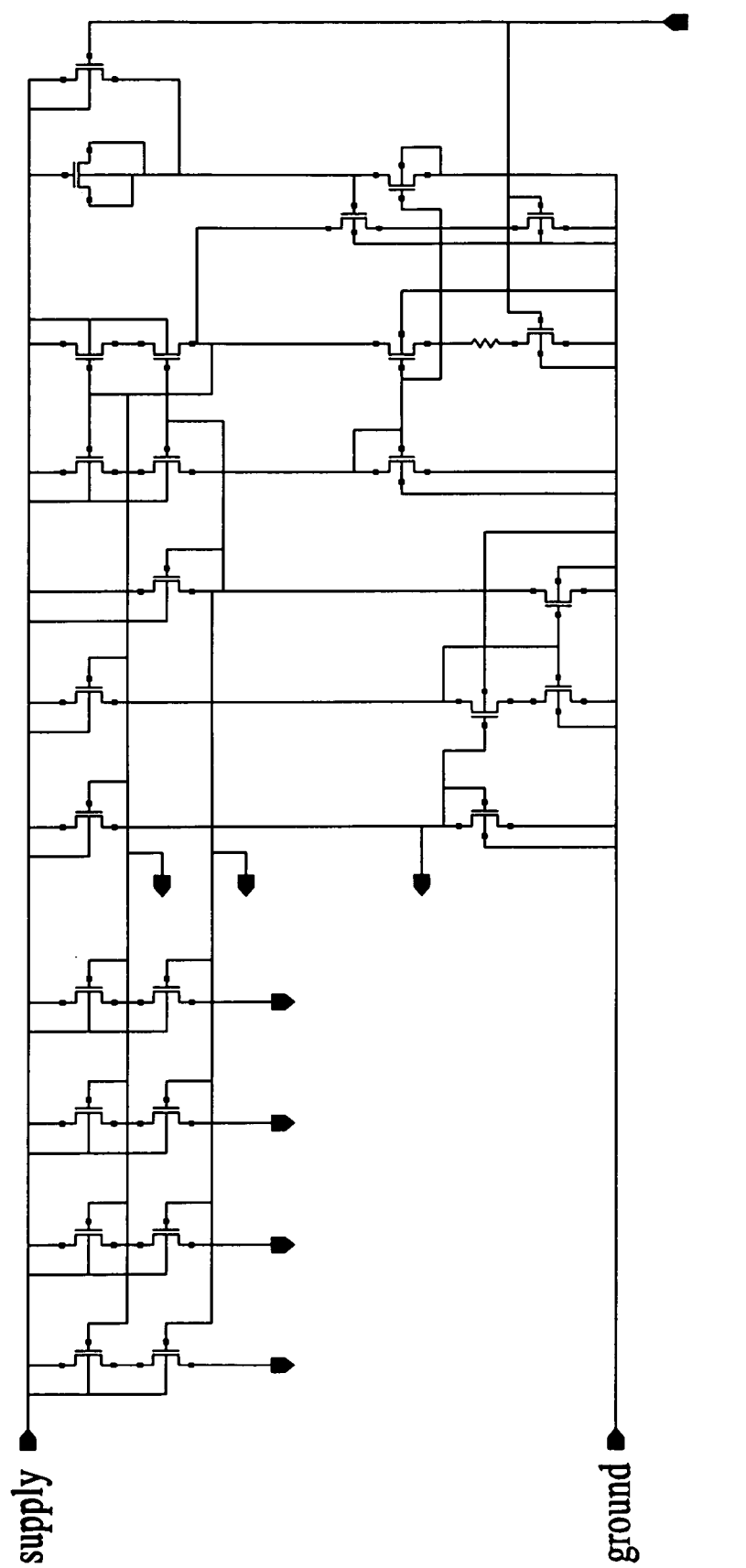
FIG. 15 is a schematic diagram of a bias cell, which may be used to implement the bias cell of FIG. 11, in accordance with the present invention.

FIG. 15 is a schematic diagram of a bias cell 1500, which may be used to implement the bias cell 1105 of FIG. 11, in accordance with the present invention.

Figure 16:
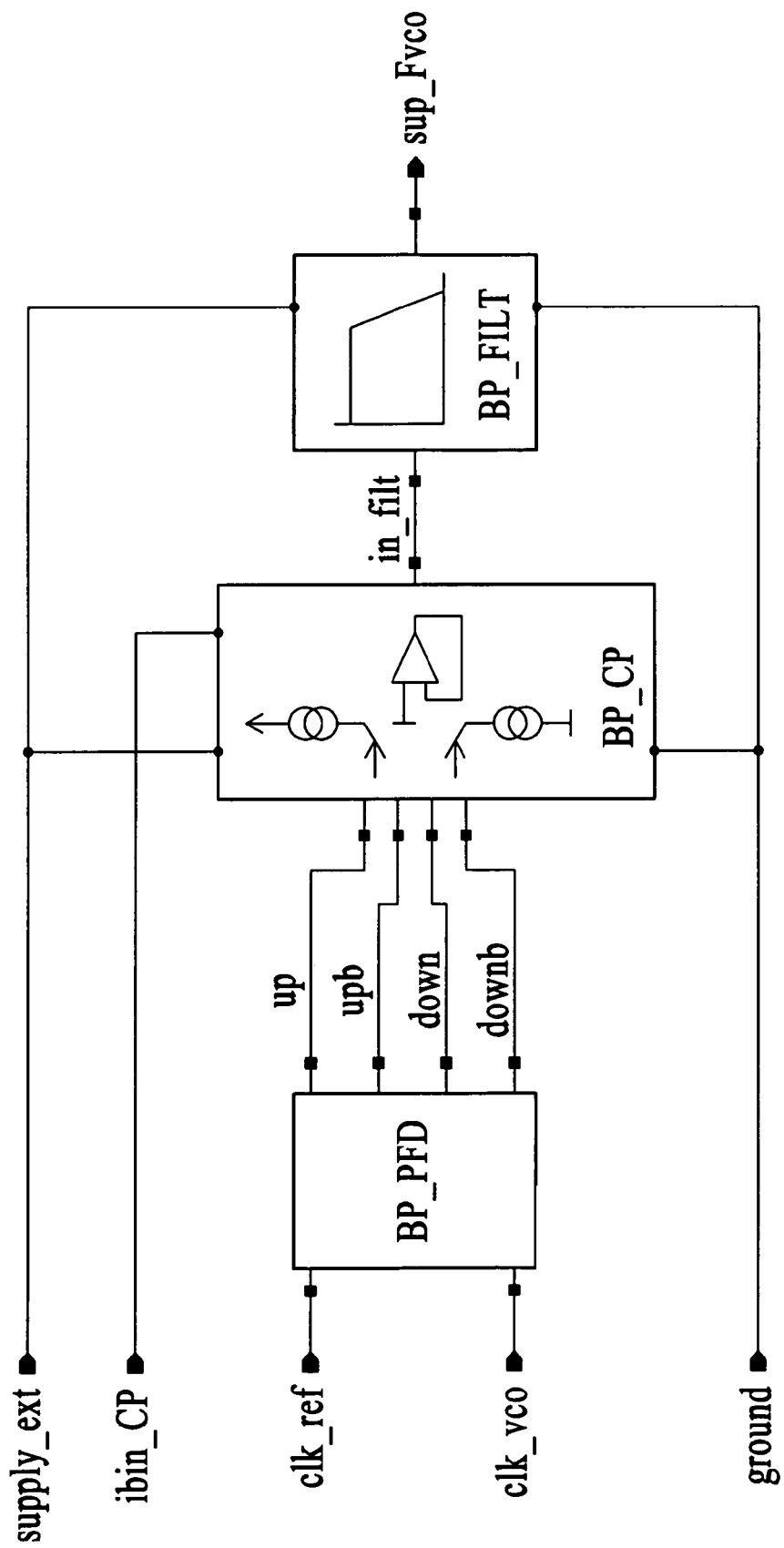
FIG. 16 is a block diagram of a PLL control cell, which may be used to implement the PDF, the charge pump (CP), and the loop filter of FIGS. 1 and 11, in accordance with the present invention.

FIG. 16 is a block diagram of a PLL control cell 1600, which may be used to implement the PDF 120, the charge pump (CP) 122, and the loop filter 124 of FIGS. 1 and 11, in accordance with the present invention.

Figure 17:
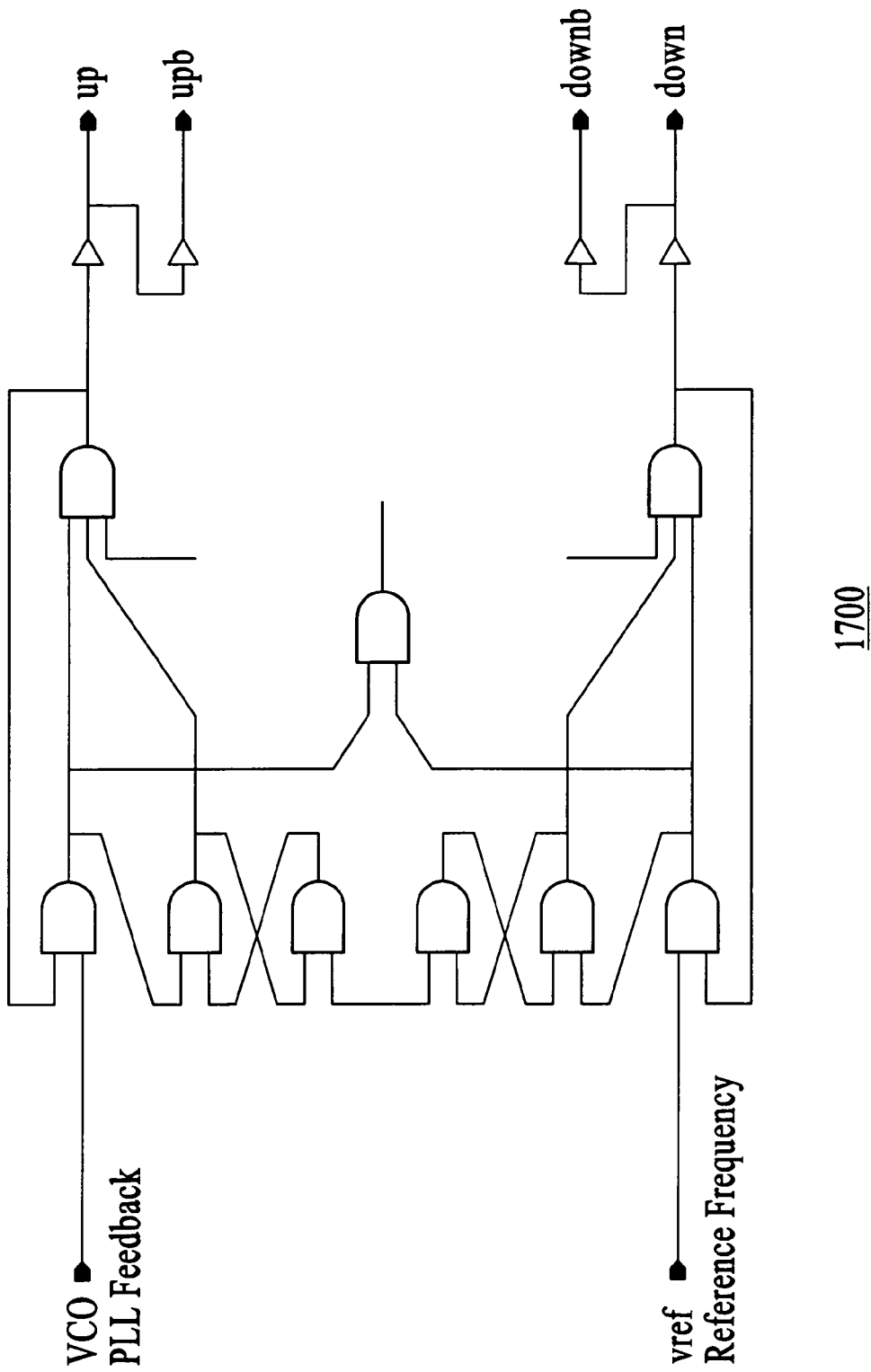
FIG. 17 is a schematic diagram of a PFD, which may be used to implement the PFD of FIGS. 1, 11, and 16, in accordance with the present invention.

FIG. 17 is a schematic diagram of a PFD 1700, which may be used to implement the PFD 120 of FIGS. 1, 11, and 16, in accordance with the present invention.

Figure 18:
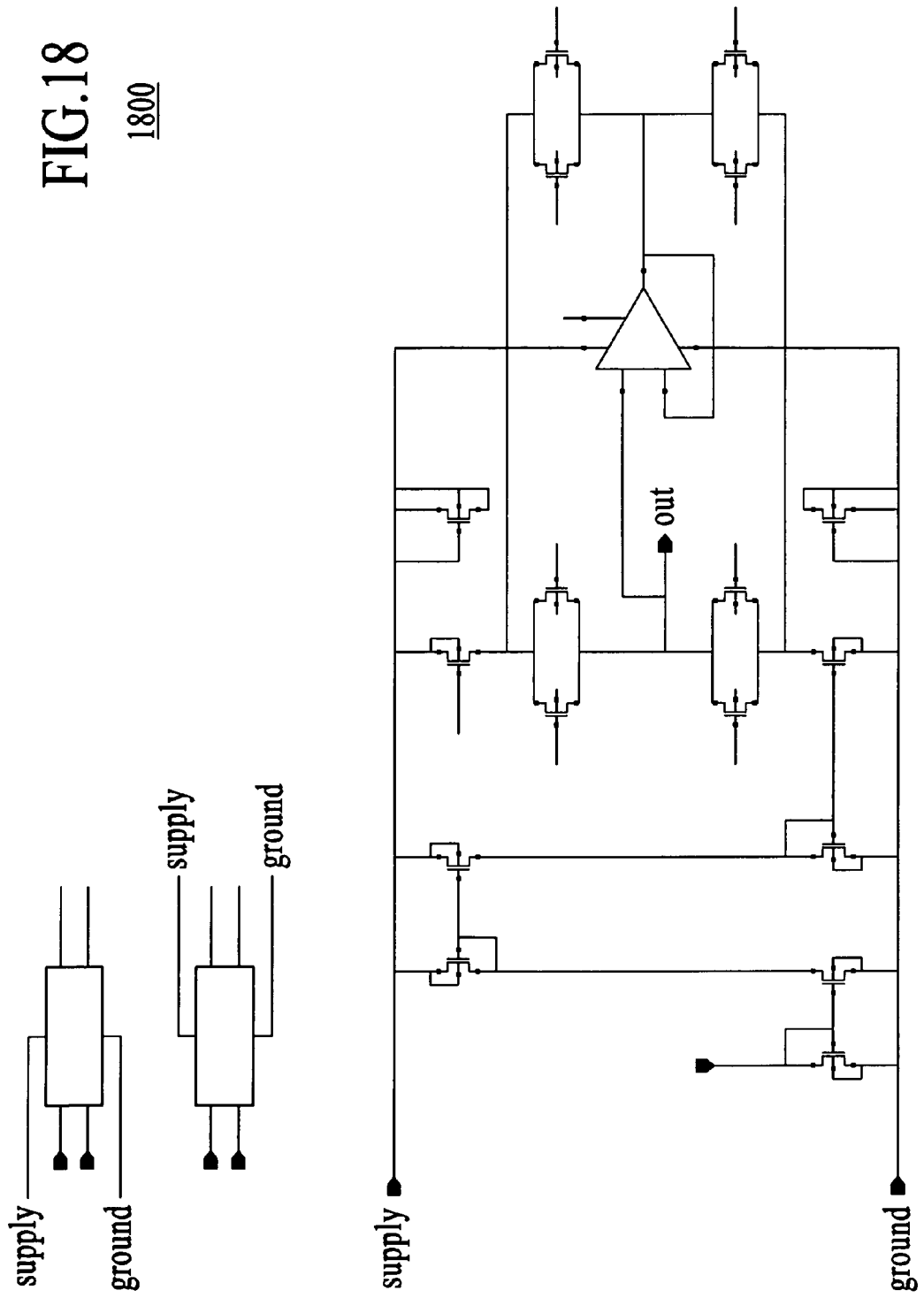
FIG. 18 is a schematic diagram of a CP, which may be used to implement the CP of FIGS. 1, 11, and 16, in accordance with the present invention.

FIG. 18 is a schematic diagram of a CP 1800, which may be used to implement the CP 122 of FIGS. 1, 11, and 16, in accordance with the present invention.

Figure 19:
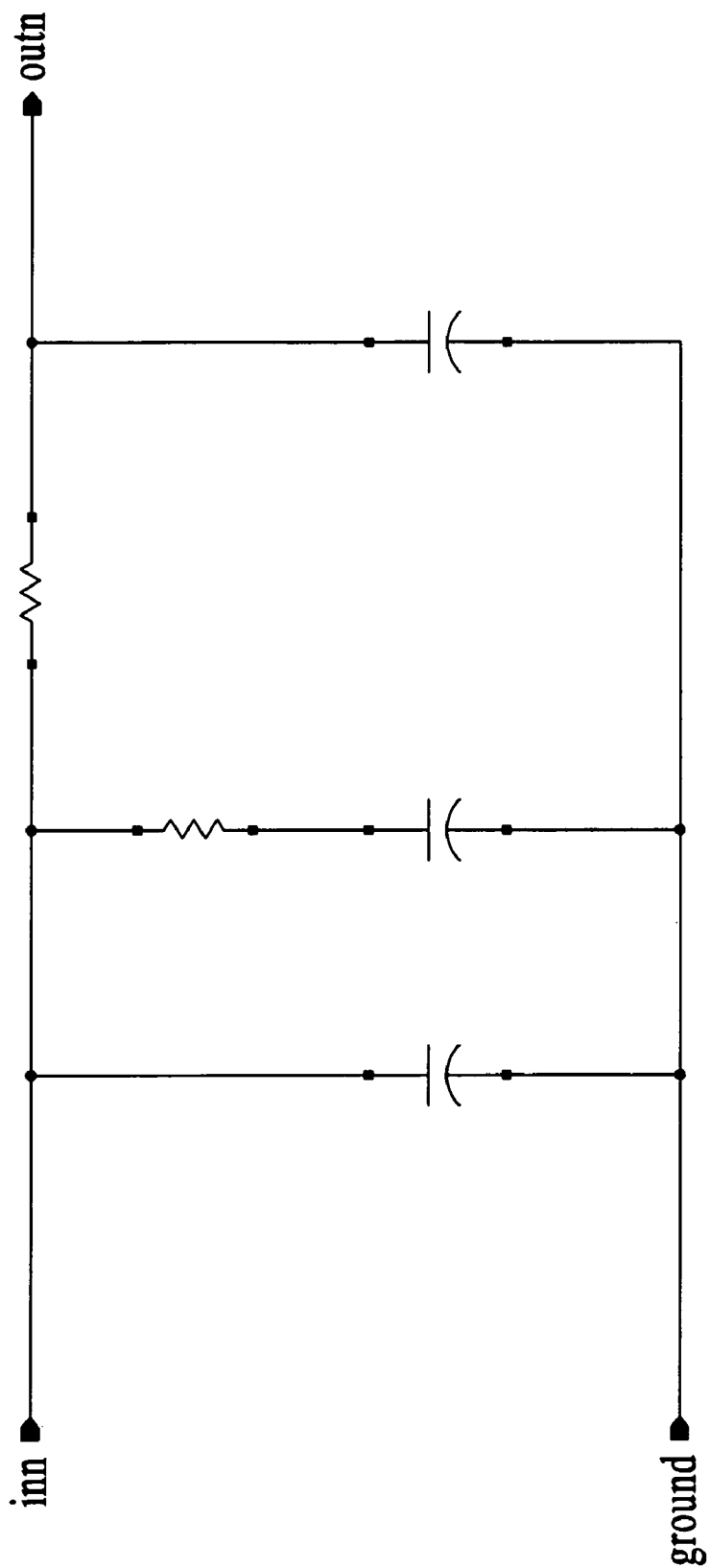
FIG. 19 is a schematic diagram of a loop filter, which may be used to implement the loop filter of FIGS. 1, 11, and 16, in accordance with the present invention.

FIG. 19 is a schematic diagram of a loop filter 1900, which may be used to implement the loop filter 124 of FIGS. 1, 11, and 16, in accordance with the present invention.

Figure 20:
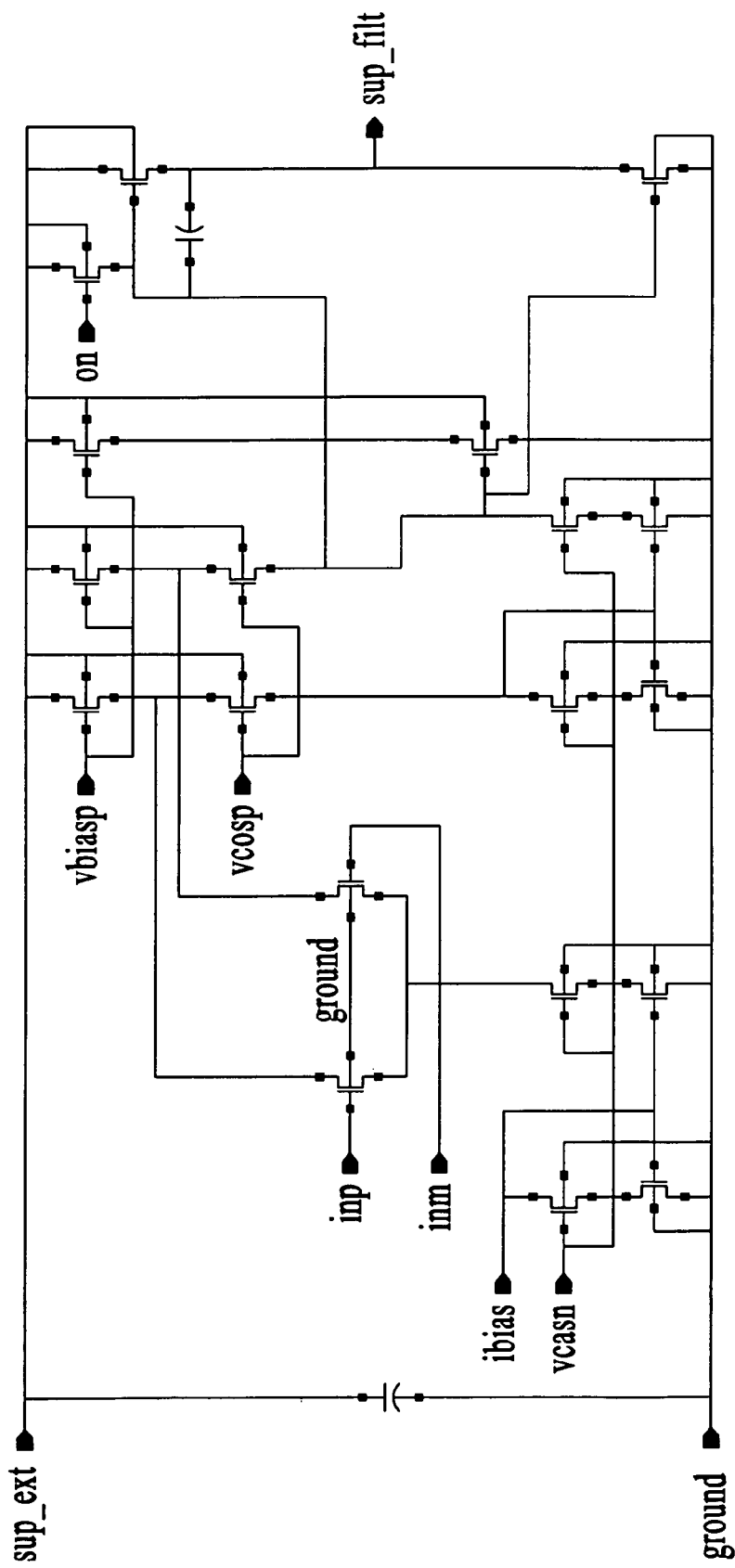
FIG. 20 is a schematic diagram of a VOC buffer, which may be used to implement the VOC buffer of FIGS. 1 and 11, in accordance with the present invention.

FIG. 20 is a schematic diagram of a VOC buffer 2000, which may be used to implement the VOC buffer 126 of FIGS. 1 and 11, in accordance with the present invention.

Figure 21:
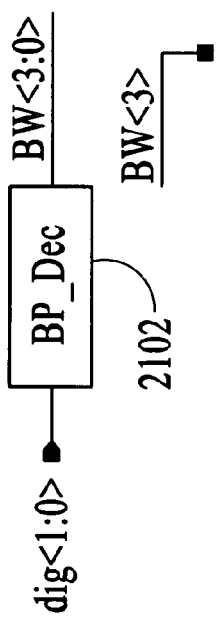
FIG. 21 is a schematic diagram of FC and BW buffers, which may be used to implement the FC and BW buffers and of FIG. 11, in accordance with the present invention.
Figure 21:
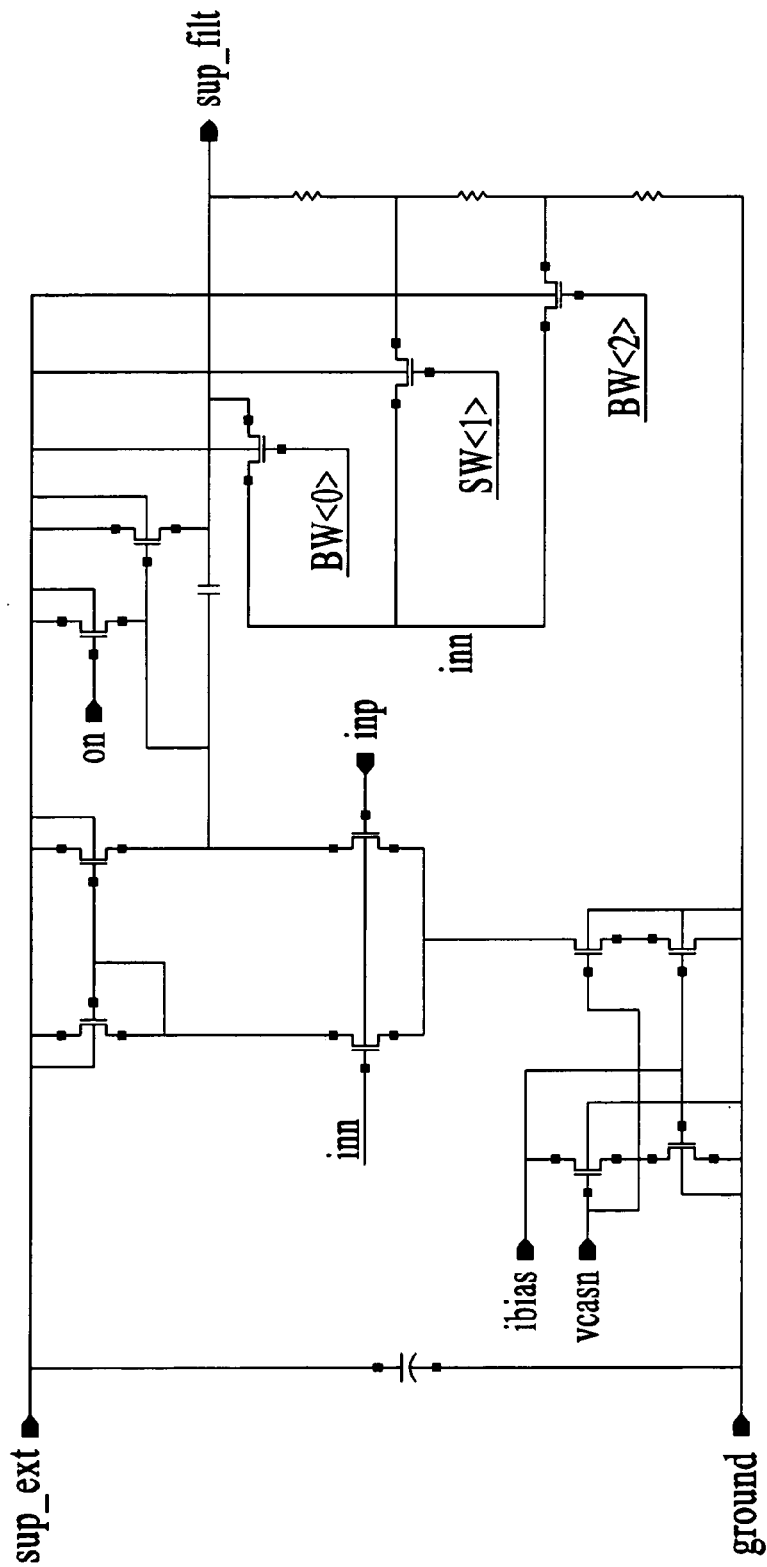

FIG. 21 is a schematic diagram of FC and BW buffers 2100, which may be used to implement the FC and BW buffers 1104 and 1106 of FIG. 11, in accordance with the present invention. The FC and BW buffers 2100 include a decoder 2102.

Figure 22:
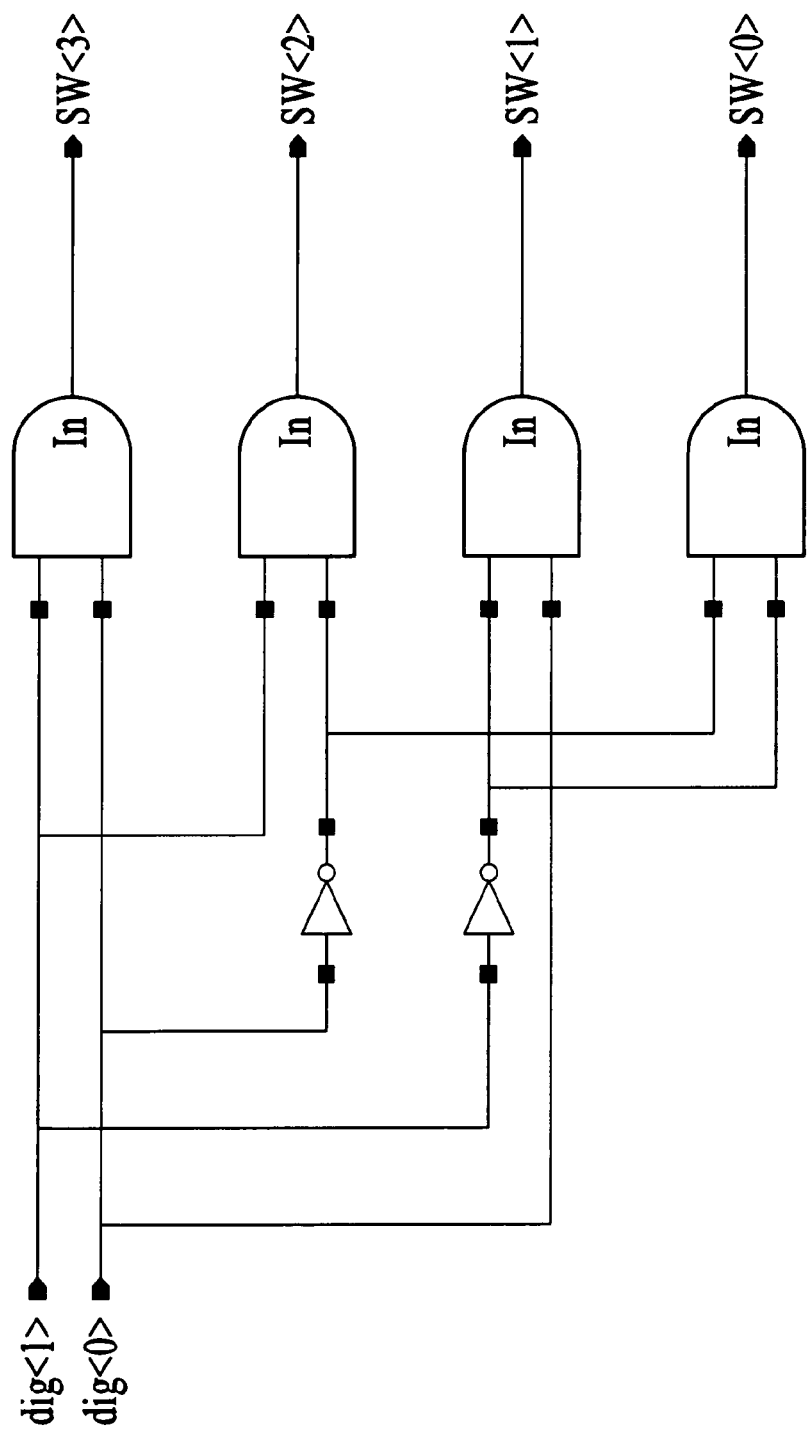
FIG. 22 is a schematic diagram of the decoder, which may be used to implement the decoder of FIG. 21, in accordance with the present invention.

FIG. 22 is a schematic diagram of the decoder 2200, which may be used to implement the decoder 2102 of FIG. 21, in accordance with the present invention. For example, in one implementation, the decoder 2200 transforms binary data (e.g., two bits) into four possible "channel" selections. As shown in FIGS. 21 and 22, switch commands SW<i> enter the FC and BW buffers 2100 to program and change the resistor bridge (feedback) in the FC and BW buffers 2100.

According to the system disclosed herein, the present invention provides numerous benefits. For example, it accommodates for process and temperature variations by providing automatic frequency tuning. Embodiments of the present invention also accommodate for process and temperature variations by providing a programmable center frequency and a programmable bandwidth.

A complex band-pass filter has been disclosed. The complex band-pass filter includes a band-pass filter that has automatic frequency tuning. In another embodiment, the complex band-pass filter also has a programmable center frequency and a programmable bandwidth. The complex band-pass filter also includes a phase locked loop that supplies separate low-impedance control voltages to the band-pass filter. One control programs the center frequency and the other control voltage programs the bandwidth.

The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

What is claimed is:

1. A circuit comprising:
a band-pass filter coupled to a voltage source, wherein the voltage source is a phase locked loop (PLL) that outputs a control voltage, the band-pass filter comprising:
a first plurality of transconductors that receives a first voltage, wherein the first voltage controls the center frequency of the band-pass filter;
a second plurality of transconductors coupled to the first plurality of transconductors, wherein the second plurality of transconductors receives a second voltage, wherein the second voltage controls the bandwidth of the band-pass filter,
a first buffer coupled between the PLL and the first plurality of transconductors;
a second buffer coupled to the PLL and the second plurality of transconductors; and wherein the first and second voltages track the control voltage to provide automatic frequency tuning for the band-pass filter, wherein the first buffer controls the first voltage to control the center frequency of the band-pass filter, and wherein the second buffer controls the second voltage to control the bandwidth of the band-pass filter.

2. The circuit of claim 1 wherein the first and second voltages equal the control voltage.

3. The circuit of claim 1 wherein the first and second buffers each include a voltage divider to control the first and second voltages to provide center frequency programmability and bandwidth programmability for the band-pass filter.

4. The circuit of claim 1 wherein the PLL comprises:
a voltage controlled oscillator (VCO); and
a VCO buffer that supplies the control voltage to the VCO.

5. The circuit of claim 4 wherein the VCO comprises a third plurality of transconductors.

6. The circuit of claim 1 wherein the transconductors of the circuit are gm-C differential transconductors.

7. The circuit of claim 1 wherein the transconductors of the circuit are Nauta transconductors.

8. A system comprising:
phase locked loop (PLL) that outputs a control voltage; and
a band-pass filter coupled to the PLL, the band-pass filter comprising:
a first plurality of transconductors adapted to receive a first voltage, wherein the first voltage controls the center frequency of the band-pass filter; and
a second plurality of transconductors coupled to the first plurality of transconductors and adapted to receive a second voltage, wherein the second voltage controls the bandwidth of the band-pass filter;
a first buffer coupled between the PLL and the first plurality of transconductors; and
a second buffer coupled to the PLL and the second plurality of transconductors, and wherein the first and second voltages track the control voltage to provide automatic frequency tuning for the band-pass filter, wherein the first buffer controls the first voltage to control the center frequency of the band-pass filter, and wherein the second buffer controls the second voltage to control the bandwidth of the band-pass filter.

9. The system of claim 8 wherein the PLL comprises:
a voltage controlled oscillator (VCO); and
a VCO buffer that supplies the control voltage to the VCO.

10. The system of claim 9 wherein the VCO comprises a third plurality of transconductors.

11. The system of claim 8 wherein the transconductors of the circuit are gm-C differential transconductors.

12. The system of claim 8 wherein the transconductors of the circuit are Nauta transconductors.

* * * * *